US010600692B2

(12) United States Patent
Hsu et al.

(10) Patent No.: US 10,600,692 B2
(45) Date of Patent: Mar. 24, 2020

(54) SEMICONDUCTOR DEVICE

(71) Applicant: UNITED MICROELECTRONICS CORP., Hsin-Chu (TW)

(72) Inventors: Hsiao-Lin Hsu, Yunlin County (TW); En-Chiuan Liou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/200,670

(22) Filed: Nov. 27, 2018

(65) Prior Publication Data

US 2019/0109050 A1  Apr. 11, 2019

Related U.S. Application Data

(62) Division of application No. 15/806,295, filed on Nov. 7, 2017, now Pat. No. 10,170,369.

(30) Foreign Application Priority Data

Oct. 6, 2017 (TW) .............................. 106134510 A

(51) Int. Cl.
*H01L 21/8234* (2006.01)
*H01L 29/78* (2006.01)
*H01L 27/088* (2006.01)
*H01L 29/40* (2006.01)
*H01L 29/66* (2006.01)

(52) U.S. Cl.
CPC ............... *H01L 21/823431* (2013.01); *H01L 21/823437* (2013.01); *H01L 21/823481* (2013.01); *H01L 27/0886* (2013.01); *H01L 29/785* (2013.01); *H01L 29/7855* (2013.01); *H01L 29/7856* (2013.01); *H01L 29/401* (2013.01); *H01L 29/66545* (2013.01)

(58) Field of Classification Search
CPC ......... H01L 21/823431; H01L 27/0886; H01L 29/785; H01L 29/7855; H01L 21/823437
See application file for complete search history.

(56) References Cited

U.S. PATENT DOCUMENTS 9,685,336 B1  6/2017 Chan
2018/0190652 A1* 7/2018 Ching ................. H01L 27/0886

OTHER PUBLICATIONS

Hung, Title of Invention: Method for Fabricating Semiconductor Device, U.S. Appl. No. 15/289,978, filed Oct. 11, 2016.

* cited by examiner

*Primary Examiner* — Selim U Ahmed
*Assistant Examiner* — Evan G Clinton
(74) *Attorney, Agent, or Firm* — Winston Hsu

(57) ABSTRACT

A semiconductor device includes a substrate having a fin structure extending along a first direction. The fin structure protrudes from a top surface of a trench isolation region and has a first height. A plurality of gate lines including a first gate line and a second gate line extend along a second direction and striding across the fin structure. The first gate line has a discontinuity directly above a gate cut region. The second gate line is disposed in proximity to a dummy fin region, and does not overlap with the dummy fin region. The fin structure has a second height within the dummy fin region, and the second height is smaller than the first height.

5 Claims, 5 Drawing Sheets

SEMICONDUCTOR DEVICE

CROSS REFERENCE TO RELATED APPLICATIONS

This is a division of U.S. application Ser. No. 15/806,295 filed Nov. 7, 2017, which is included in its entirety herein by reference.

BACKGROUND OF THE INVENTION

1. Field of the Invention

The present invention relates to the field of semiconductor technology, and in particular to a FinFET semiconductor device and a method for fabricating the same.

2. Description of the Prior Art

In recent years, due to the miniaturization of various consumer electronic products, the size of the semiconductor devices must be minimized to meet the high degree of integration, high performance, low power consumption and a variety of product requirements. However, with the miniaturization of electronic products, the existing planar field effect transistor (planar FET) has been gradually filed to meet the requirements of the product. Thus, non-planar field-effect transistors such as fin-type field effect transistors (FinFETs) have been developed in the art to achieve high drive currents and to alleviate short channel effects.

It is known that the FinFETs can be fabricated using a slot-cut first process in which a cut-off region of a poly line is pre-formed in a polysilicon layer overlying the fin structure, and then the lithography process and etching process are performed to pattern the polysilicon layer to thereby form the poly line. However, the prior art slot-cut first process results in a loading effect when coating the organic dielectric layer (ODL), which affects the yield of the process. Therefore, there is still a need for an improved manufacturing method in this field.

SUMMARY OF THE INVENTION

The main object of the present invention is to provide an improved semiconductor device and a method for fabricating the same, which can solve the disadvantages and shortcomings of the prior art.

According to one aspect of the invention, a method for fabricating a semiconductor device is disclosed. A substrate having thereon a trench isolation region and a plurality of fin structures extending along a first direction is provided. The plurality of fin structures protrude from a top surface of the trench isolation region. A polysilicon layer is deposited over the substrate. A poly cut opening and a dummy opening are formed in the polysilicon layer. An organic dielectric layer (ODL) is coated over the substrate. The ODL fills into the poly cut opening and the dummy opening. A hard mask layer is deposited on the ODL. A plurality of photoresist line patterns comprising a first photoresist line pattern and a second photoresist line pattern are formed. The photoresist line patterns extend along a second direction on the hard mask layer. The first photoresist line pattern overlaps with the poly cut opening. The second photoresist line pattern is disposed in proximity to the dummy opening, and does not overlap with the dummy opening. The photoresist line patterns are transferred to the polysilicon layer, thereby forming a plurality of poly lines extending along the second direction.

According to another aspect of the invention, a semiconductor device includes a substrate having a fin structure extending along a first direction. The fin structure protrudes from a top surface of a trench isolation region and has a first height. A plurality of gate lines including a first gate line and a second gate line extend along a second direction and striding across the fin structure. The first gate line has a discontinuity directly above a gate cut region. The second gate line is disposed in proximity to a dummy fin region, and does not overlap with the dummy fin region. The fin structure has a second height within the dummy fin region, and the second height is smaller than the first height.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
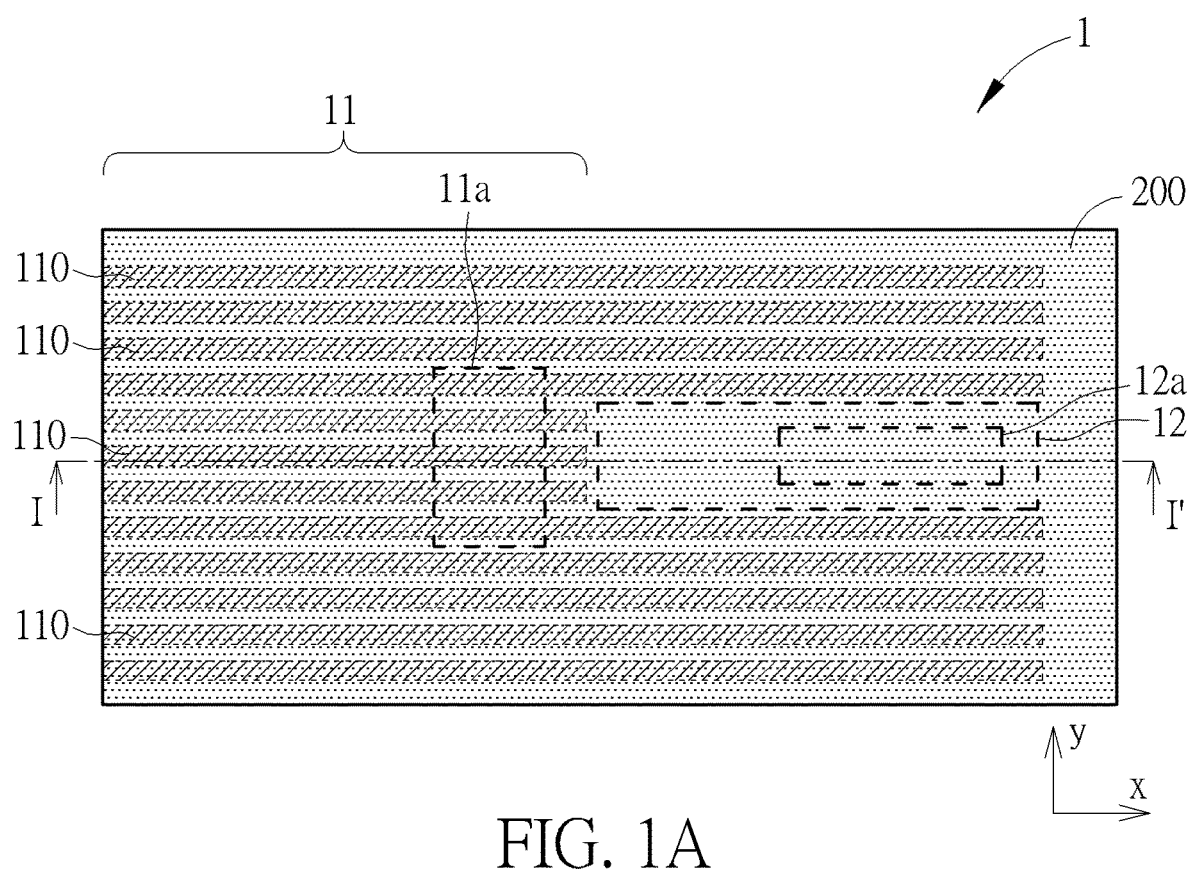
FIG. 1A is a schematic top view showing a semiconductor substrate after the formation of fin structures and after the blanket deposition of a polysilicon layer according to one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

Figure 1B:
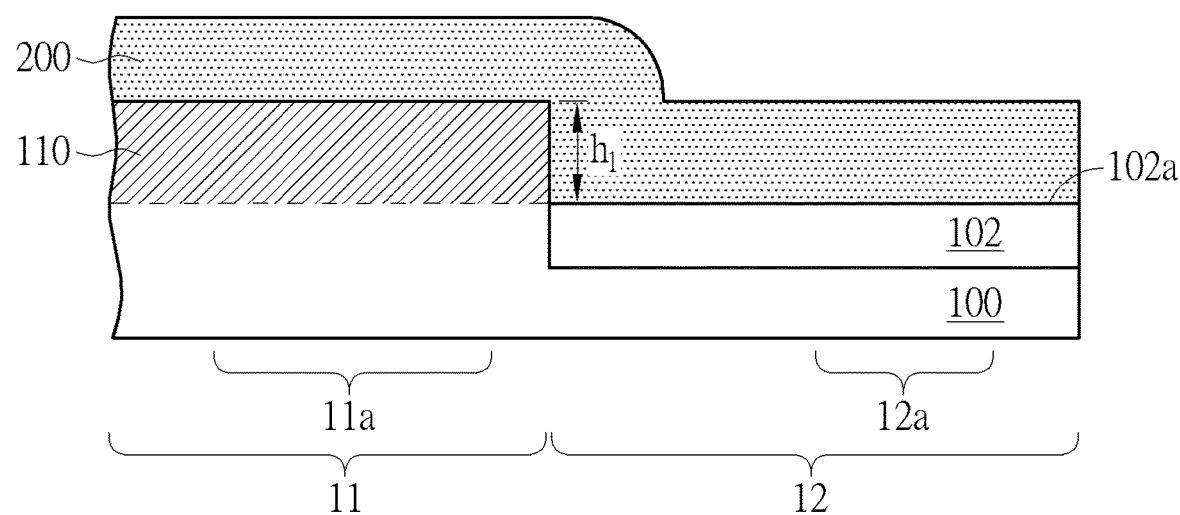
FIG. 1B is a schematic, cross-sectional view taken along line I-I' in FIG. 1A.

Please refer FIG. 1A and FIG. 1B. FIG. 1A is a schematic top view showing a semiconductor substrate after the formation of fin structures and after the blanket deposition of a polysilicon layer according to one embodiment of the invention. FIG. 1B is a schematic, cross-sectional view taken along line I-I' in FIG. 1A.

According to an embodiment of the present invention, the present invention discloses a method of fabricating a semiconductor device 1, for example, the semiconductor device 1 may be a fin-type semiconductor device or a FinFET semiconductor device, but is not limited thereto. First, a trench isolation region 102 and a plurality of fin structures 110 are formed on a substrate 100. According to an embodiment of the present invention, the substrate 100 may be a semiconductor substrate, such as a silicon substrate, but is not limited thereto. The fin structures 110 extend along a first direction (i.e., reference x-axis direction). The fin structures 110 protrude from a top surface 102a of the trench isolation region 102.

As shown in FIG. 1A, the fin structures 110 form the dense pattern area 11. On the substrate 100, there may be a non-dense region 12 in which only the trench isolation region 102 is formed in the non-dense region 12 and no fin structure 110 is formed within the non-dense region 12.

According to an embodiment of the present invention, the dense pattern area 11 includes a dummy fin region 11a adjacent to the non-dense region 12. According to an embodiment of the present invention, any circuit element, such as a transistor, a doped region, or a contact element, is not formed on the fin structure 110 of the dummy fin region 11a. According to an embodiment of the present invention, a gate cut region 12a is provided in the non-dense region 12. The gate cut region 12a may completely overlap the trench isolation region 102 without overlapping the fin structures 110, but is not limited thereto.

According to an embodiment of the present invention, a polysilicon layer 200 is deposited on the substrate 100 in a blanket manner. The polysilicon layer 200 covers the plurality of fin structures 110 within the dense pattern area 11 and the trench isolation region 102 within the non-dense region 12. As can be seen from FIG. 1B, the fin structure 110 protrudes from the top surface 102a of the trench isolation region 102 and has a first height $h_1$. A step height is formed at the interface between the dense pattern region 11 and the non-dense region 12.

Figure 2A:
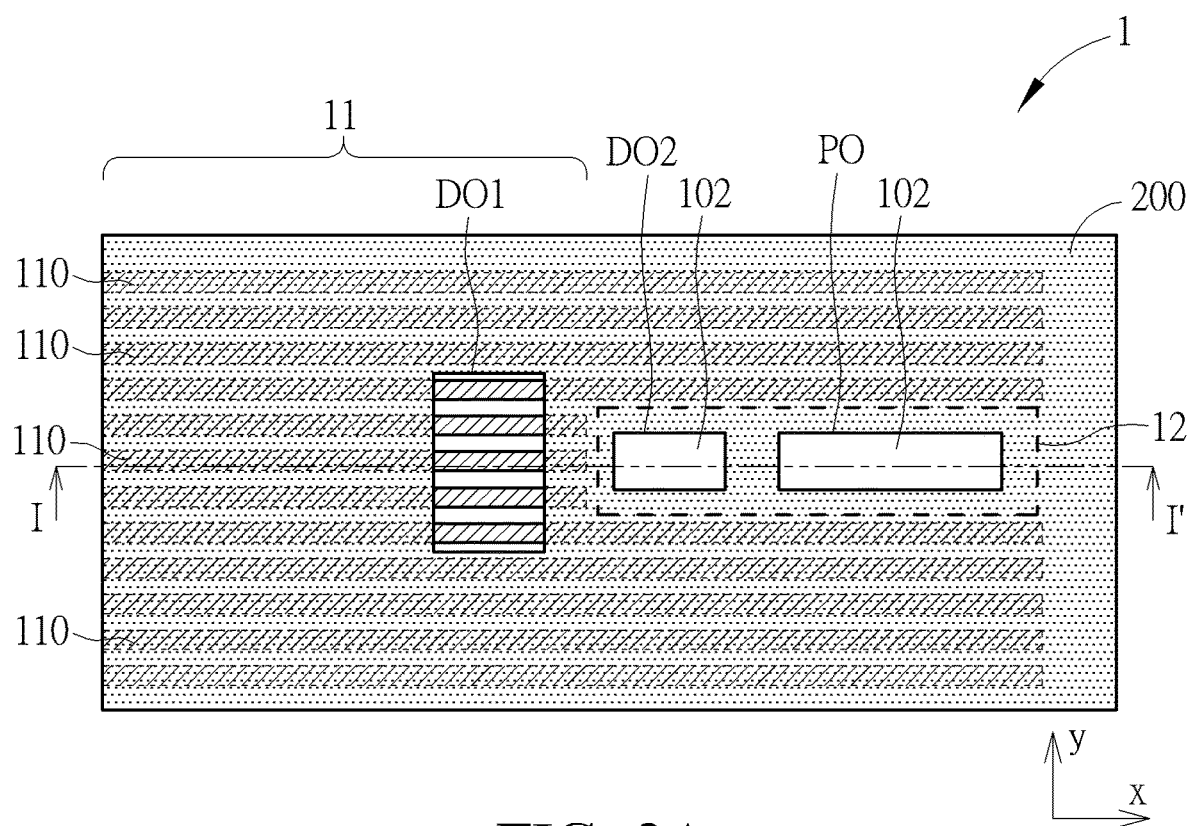
FIG. 2A is a schematic top view showing a semiconductor substrate after the formation of a poly cut opening and dummy openings in the polysilicon layer according to one embodiment of the invention.
Figure 2B:
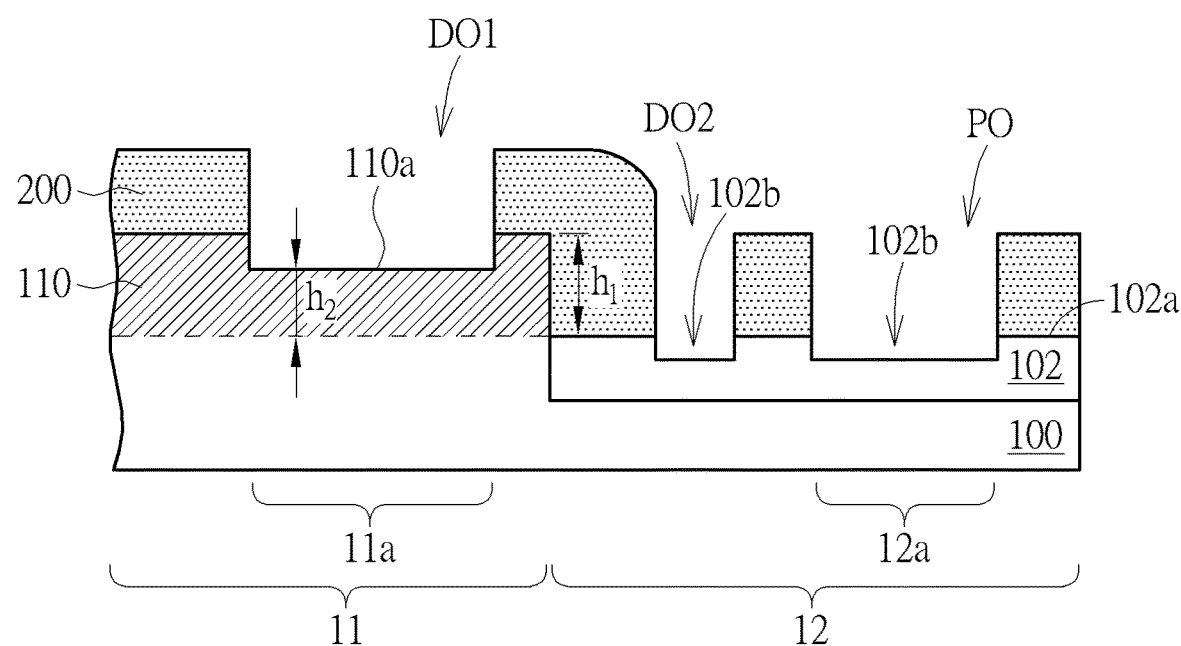
FIG. 2B is a schematic, cross-sectional view taken along line I-I' in FIG. 2A.

Please refer FIG. 2A and FIG. 2B. FIG. 2A is a schematic top view showing a semiconductor substrate after the formation of a poly cut opening and dummy openings in the polysilicon layer according to one embodiment of the invention. FIG. 2B is a schematic, cross-sectional view taken along line I-I' in FIG. 2A.

As shown in FIGS. 2A and 2B, a poly cut opening PO, a dummy opening DO1 and a dummy opening DO2 are formed in the polysilicon layer 200. The poly cut opening PO, dummy openings DO1 and dummy openings DO2 may be formed by using the same lithography process and etching process.

According to an embodiment of the present invention, the dummy opening DO1 is located directly on the dummy fin region 11a and the dummy opening DO1 exposes the fin structures 110 within the dummy fin region 11a. The poly cut opening PO is directly located on the gate cut region 12a and is completely overlapped with the gate cut region 12a. The dummy opening DO2 is adjacent to the poly cut opening PO and is located directly on the trench isolation region 102.

According to an embodiment of the present invention, portions of the fin structures 110 within the dummy fin region 11a may be further etched away via the dummy opening DO1 such that the fin structures 110 has a second height $h_2$ in the dummy fin region 11a, and the second height $h_2$ is smaller than the first height $h_1$.

In addition, the method of the present invention further includes recess etching the trench isolation region 102 via the poly cut opening PO and the dummy opening DO2, thereby forming a recessed structure 102b on the trench isolation region 102 within the gate cut region 12a and the dummy opening DO2.

According to an embodiment of the present invention, the top surface 110a of the fin structure 110 within the dummy fin region 11a is still higher than the top surface 102a of the trench isolation region 102.

Figure 3A:
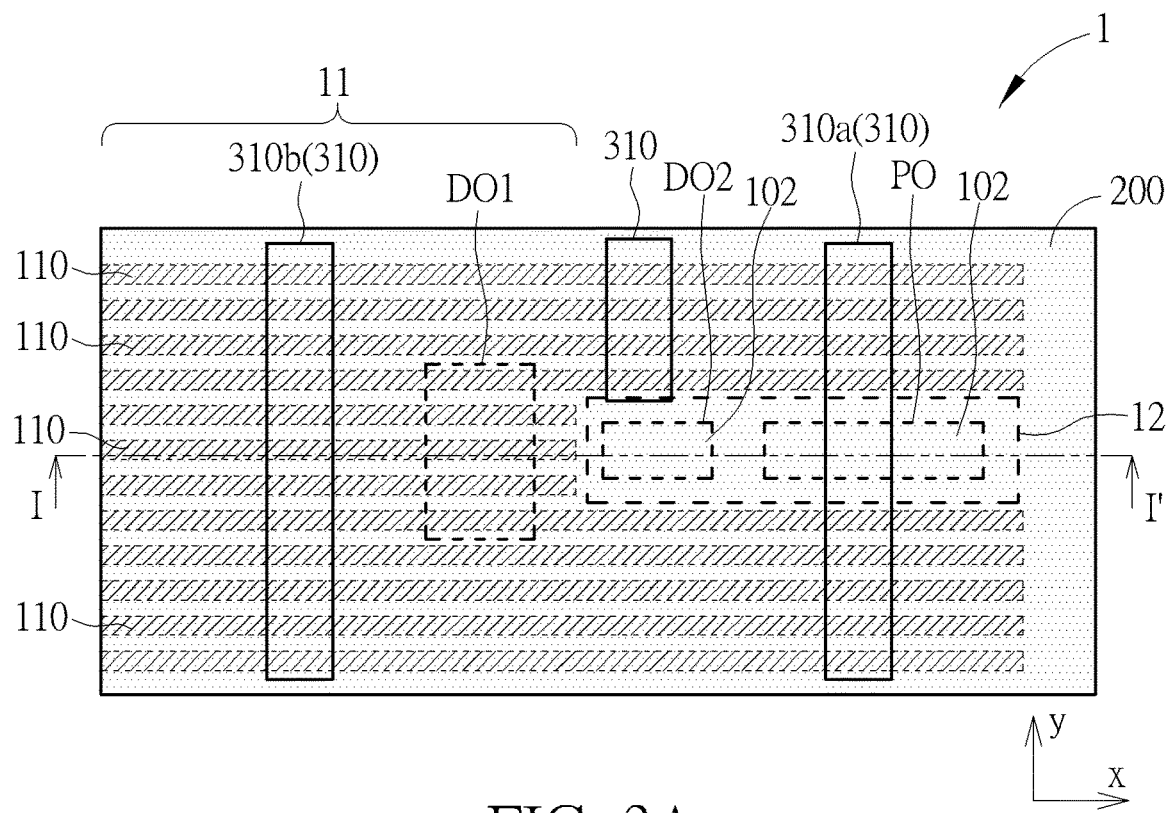
FIG. 3A is a schematic top view showing a semiconductor substrate after the formation of photoresist line patterns according to one embodiment of the invention.
Figure 3B:
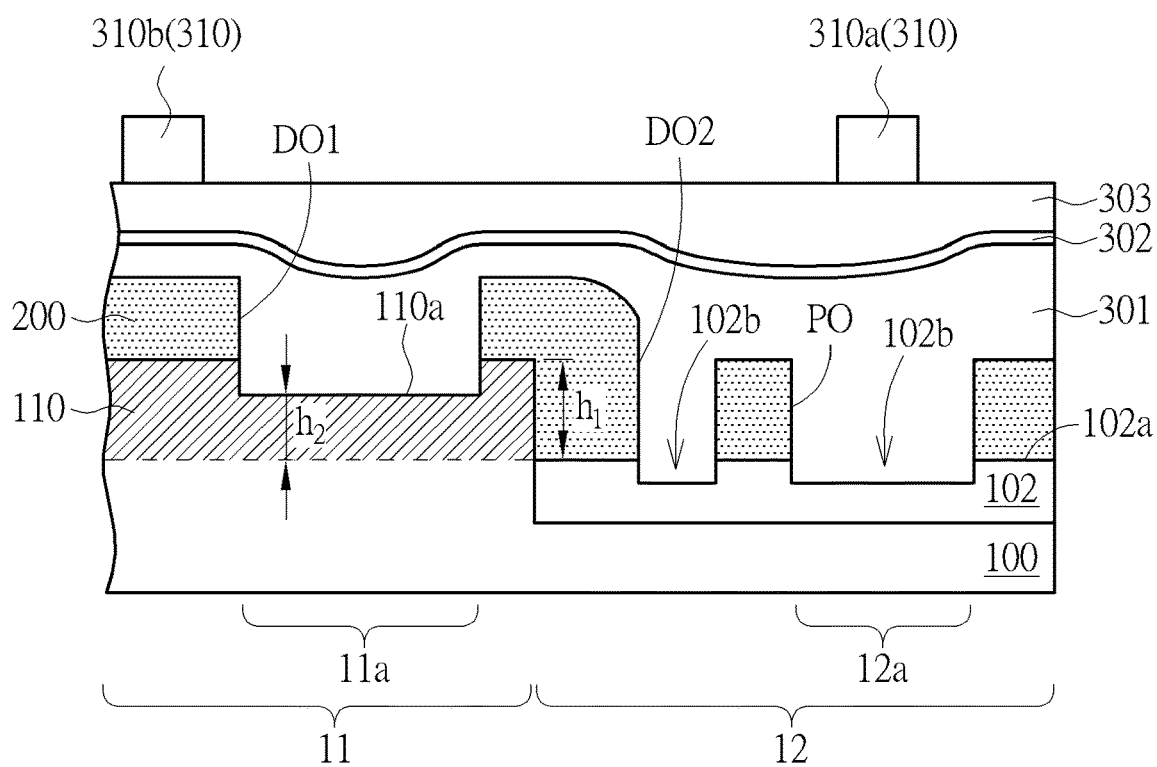
FIG. 3B is a schematic, cross-sectional view taken along line I-I' in FIG. 3A.

Please refer FIG. 3A and FIG. 3B. FIG. 3A is a schematic top view showing a semiconductor substrate after the formation of photoresist line patterns according to one embodiment of the invention. FIG. 3B is a schematic, cross-sectional view taken along line I-I' in FIG. 3A.

As shown in FIGS. 3A and 3B, after the poly cut opening PO, the dummy opening DO1 and the dummy opening DO2 are formed in the polysilicon layer 200, an organic dielectric layer (ODL) 301 is deposited on the substrate 100. The poly cut opening PO and the dummy openings DO1 and DO2 are filled with the ODL 301. Next, a bottom anti-reflective layer 302 may be formed on the ODL 301. Then, a hard mask layer 303 may be deposited on the bottom anti-reflective layer 302, for example, a silicon nitride layer.

Subsequently, a plurality of photoresist line patterns 310 are formed on the hard mask layer 303, which includes a first photoresist line pattern 310a and a second photoresist line pattern 310b extending in a second direction (i.e., a reference y-axis direction), wherein the first photoresist line pattern 310a overlaps the poly cut opening PO, and the second photoresist line pattern 310b is adjacent to the dummy opening DO1 and does not overlap with the dummy opening DO1. According to an embodiment of the present invention, the plurality of photoresist line patterns 310 are not overlapped with the dummy opening DO1 or the dummy opening DO2.

Figure 4A:
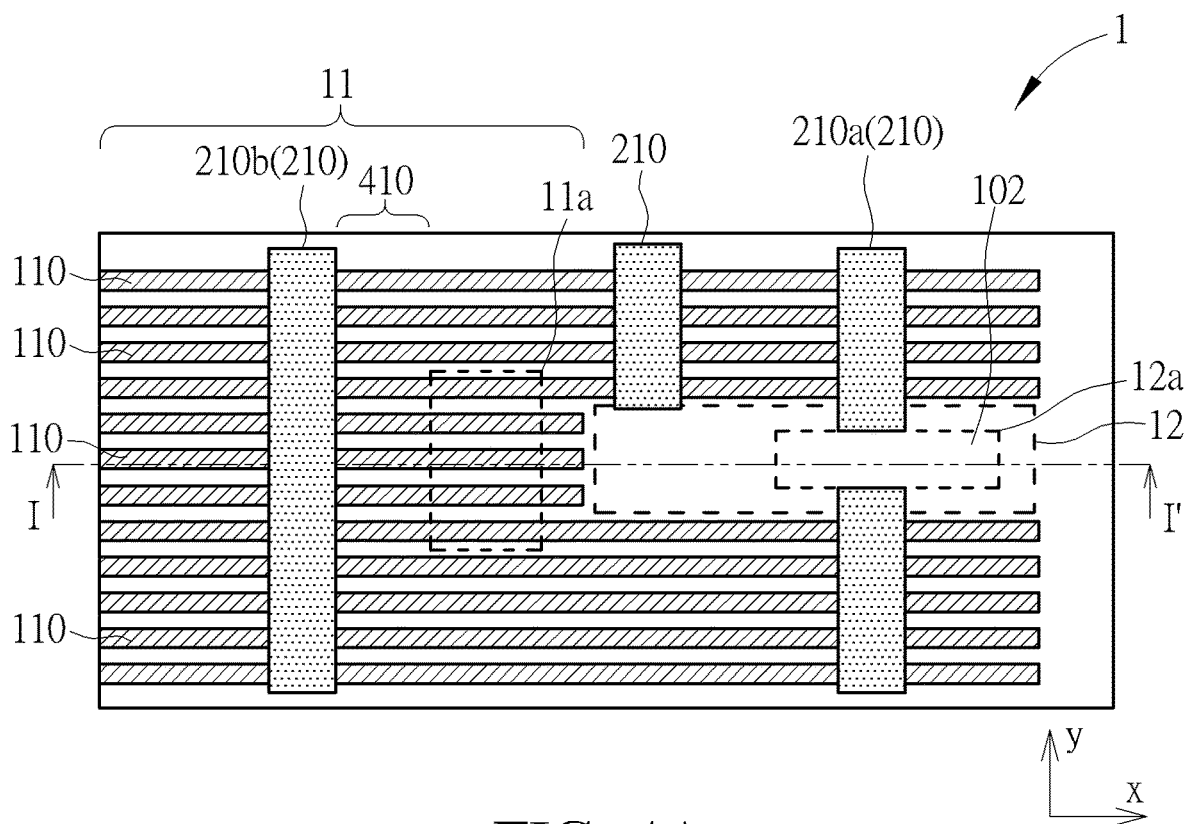
FIG. 4A is a schematic top view showing a semiconductor substrate after the transferring the photoresist line patterns to the underlying polysilicon layer according to one embodiment of the invention.
Figure 4B:
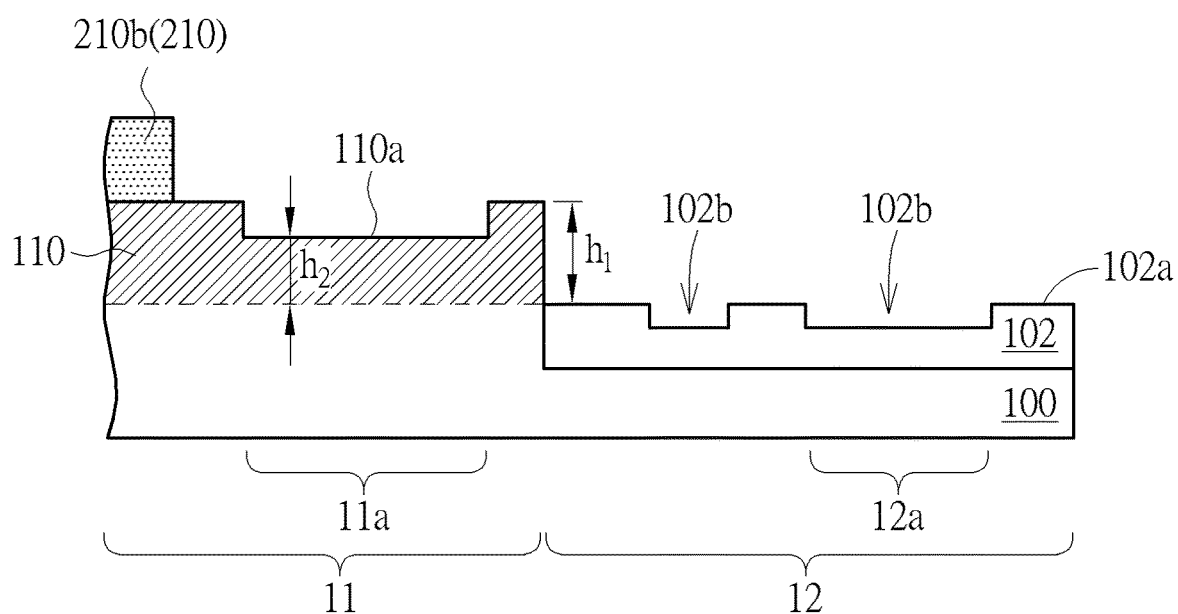
FIG. 4B is a schematic, cross-sectional view taken along line I-I' in FIG. 4A.

Please refer FIG. 4A and FIG. 4B. FIG. 4A is a schematic top view showing a semiconductor substrate after the transferring the photoresist line patterns to the underlying polysilicon layer according to one embodiment of the invention. FIG. 4B is a schematic, cross-sectional view taken along line I-I' in FIG. 4A.

As shown in FIG. 4A and FIG. 4B, the photoresist line patterns 310 are transferred to the polysilicon layer 200, thereby forming a plurality of poly lines 210 extending in the second direction. The poly lines 210 include a first poly line 210a corresponding to the first photoresist line pattern 310a, wherein the first poly line 210a is cut off or intersected by the poly cut opening PO.

According to an embodiment of the present invention, the poly lines 210 further comprise a second poly line 210b corresponding to the second photoresist line pattern 310b, wherein the second poly line 210b does not overlap the dummy fin region 11a.

According to an embodiment of the present invention, a source/drain contact region 410 is provided between the second poly line 210b and the dummy fin region 11a.

Figure 5A:
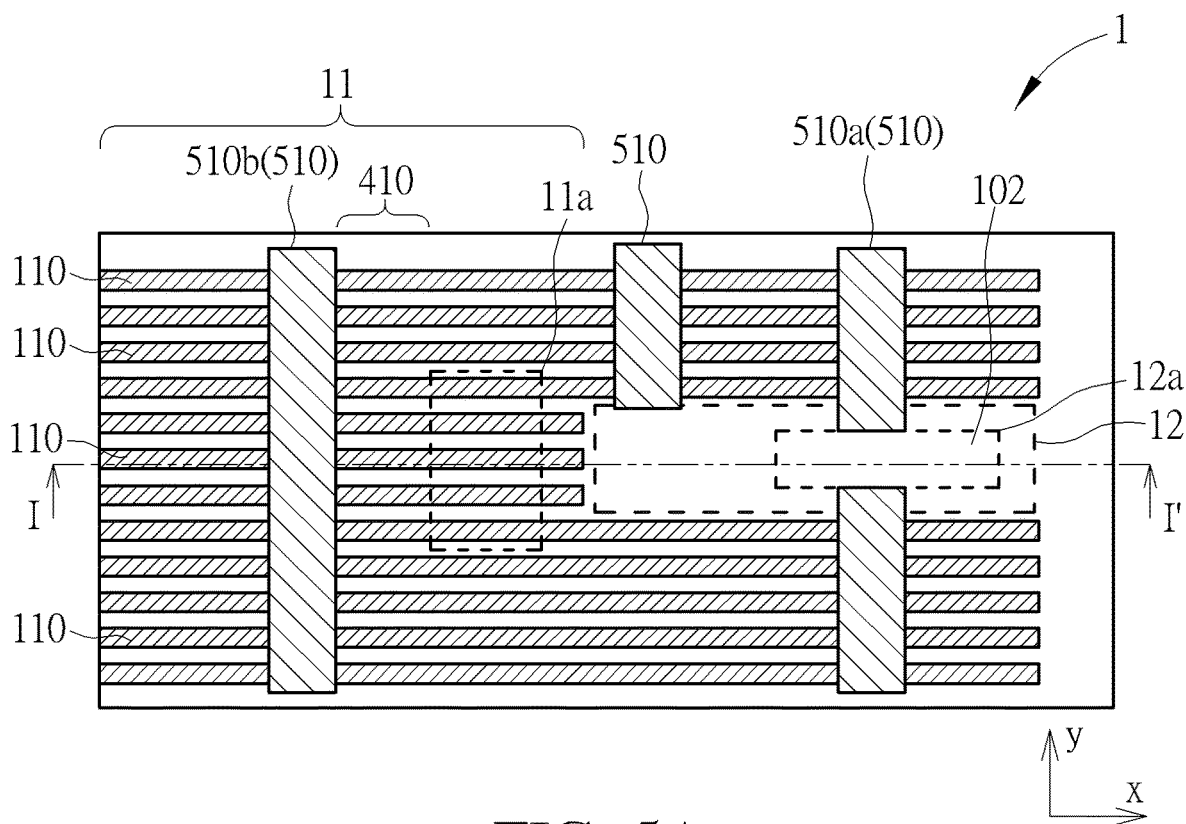
FIG. 5A is a schematic top view showing a semiconductor substrate after the replacement metal gate (RMG) process according to one embodiment of the invention.
Figure 5B:
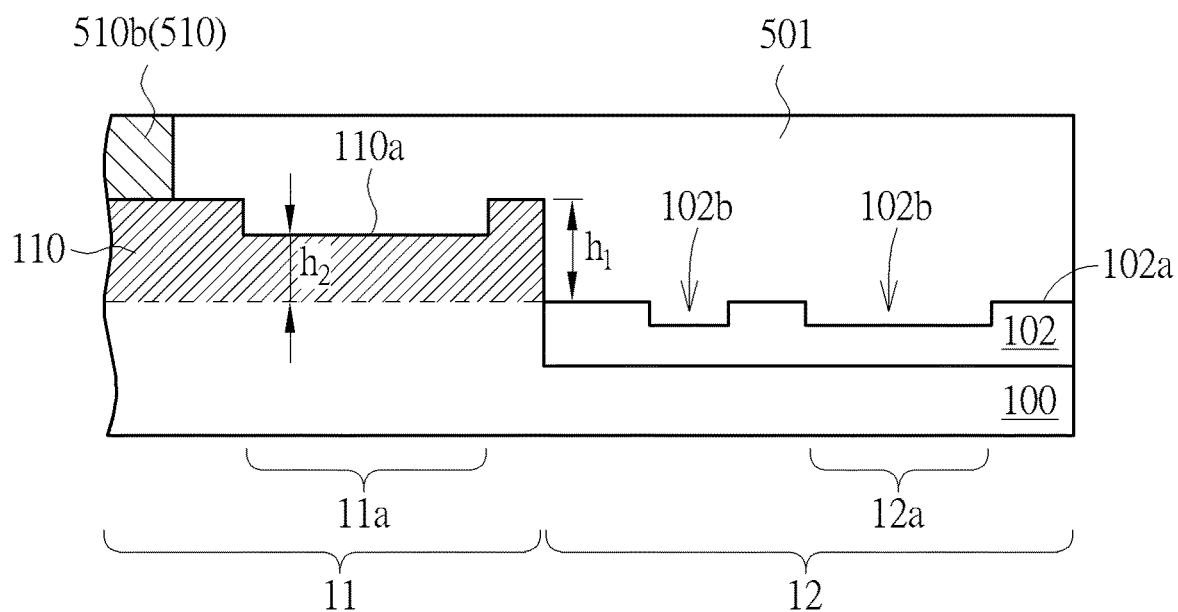
FIG. 5B is a schematic, cross-sectional view taken along line I-I' in FIG. 5A.

Please refer FIG. 5A and FIG. 5B. FIG. 5A is a schematic top view showing a semiconductor substrate after the replacement metal gate (RMG) process according to one embodiment of the invention. FIG. 5B is a schematic, cross-sectional view taken along line I-I' in FIG. 5A.

As shown in FIGS. 5A and 5B, a dielectric layer 501 is formed on the substrate 100 and planarized. Then, the plurality of poly lines 210 are replaced with a plurality of metal gate lines 510 including a first gate line 510a and a second gate line 510b extending in the second direction and across the fin structures 110 by a replacement metal gate (RMG) process, where the first gate line 510a is discontinuous in the gate cut region 12a and the second gate line 510b is adjacent to the dummy fin region 11a and does not overlap the dummy fin region 11a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate having thereon a trench isolation region and a fin structure extending along a first direction, wherein the fin structure protrudes from a top surface of the trench isolation region and has a first height; and
a plurality of gate lines comprising a first gate line and a second gate line extending along a second direction and striding across the fin structure, wherein the first gate line has a discontinuity directly above a gate cut region, and the second gate line is disposed in proximity to a dummy fin region, and does not overlap with the dummy fin region, wherein the fin structure has a second height within the dummy fin region, and the second height is smaller than the first height, wherein a non-dense region and a recess are disposed above the trench isolation region, and the recess is disposed at a bottom of the non-dense region within the gate cut region partially along the first direction.

2. The semiconductor device according to claim 1, wherein the gate cut region is completely overlapped with the trench isolation region and does not overlap with the fin structure.

3. The semiconductor device according to claim 1, wherein a top surface of the fin structure within the dummy fin region is higher than the top surface of the trench isolation region.

4. The semiconductor device according to claim 1, wherein the substrate has a first top surface, a second side surface, and a third top surface, all of which are connected along a same plane, the trench isolation region is disposed on the second side surface and the third top surface, and the fin structure is disposed on the first top surface.

5. The semiconductor device according to claim 1, wherein the dummy fin region is directly and integrally connected with the fin structure.

* * * * *